United States Patent
Glovatsky et al.

[19]

[11] Patent Number: 5,878,661
[45] Date of Patent: Mar. 9, 1999

[54] SELF-SHEARING STENCIL

[75] Inventors: Andrew Zachary Glovatsky, Livonia; Vivek Amir Jairazbhoy, Farmington Hills; Jeff Lin, Canton; John Trublowski, Troy, all of Mich.

[73] Assignee: Ford Motor Company, Dearborn, Mich.

[21] Appl. No.: 114,118

[22] Filed: Jul. 13, 1998

[51] Int. Cl.⁶ .................................................. B05C 17/06
[52] U.S. Cl. ........................................... 101/127; 29/854
[58] Field of Search ................... 101/127, 127.1, 101/128.4, 128.21, 129; 427/96; 29/854, 840

[56] References Cited

U.S. PATENT DOCUMENTS

| | | | |
|---|---|---|---|
| 4,084,506 | 4/1978 | Nakatani | 101/127 |
| 4,135,020 | 1/1979 | Maxwell | 428/131 |
| 4,270,465 | 6/1981 | Lim | 101/127 |
| 4,311,267 | 1/1982 | Lim | 228/180 |
| 4,319,524 | 3/1982 | Dunham et al. | 101/128 |
| 4,791,006 | 12/1988 | Galvagni et al. | 427/282 |
| 4,872,261 | 10/1989 | Sanyal et al. | 29/840 |
| 5,361,695 | 11/1994 | Tagaki et al. | 101/127 |
| 5,373,786 | 12/1994 | Umaba | 101/127 |
| 5,460,316 | 10/1995 | Hefele | 228/39 |
| 5,478,699 | 12/1995 | Blessington et al. | 430/308 |
| 5,565,033 | 10/1996 | Gaynes et al. | 118/210 |
| 5,593,080 | 1/1997 | Teshima et al. | 228/39 |
| 5,669,970 | 9/1997 | Balog et al. | 118/213 |
| 5,681,387 | 10/1997 | Schmidt | 118/105 |
| 5,813,331 | 9/1998 | Tan et al. | 101/129 |

*Primary Examiner*—Edgar Burr
*Assistant Examiner*—Charles H. Nolan, Jr.
*Attorney, Agent, or Firm*—Leslie C. Hodges

[57] ABSTRACT

There is disclosed herein a self-shearing stencil for use in applying solder paste or other bonding material atop a printed circuit board (PCB) in a predefined pattern. The stencil 50 has a top surface 12, a bottom surface 14, a first surface cavity 16 in the top surface, and a second surface cavity 18 in the bottom surface proximate the first surface. The cavities 16/18 overlap in a predefined manner so as to be in open communication with each other. When the stencil is placed on the PCB, the cavities are filled with solder paste and the PCB is then lowered away from the stencil, whereupon a bottom ledge 26 (defined by the stencil material underneath the first cavity) shears off the solder paste in the first cavity from the paste in the second cavity.

20 Claims, 4 Drawing Sheets

SELF-SHEARING STENCIL

BACKGROUND OF THE INVENTION

1. Field of the Invention

The present invention relates generally to printed circuit boards, and more particularly to stencils for applying solder paste therethrough onto printed circuit boards.

2. Disclosure Information

In FIGS. 1A–D and 2, a stencil 70 for applying solder paste 72 atop a printed circuit board (PCB) substrate 30 is illustrated. The stencil is typically a metallic sheet or foil with small apertures 74 defined therein, wherein the apertures are sized and arranged so as to correspond with the copper mounting pads 76 on the substrate. The steps for using the stencil involve: (1) placing the stencil 70 on the substrate 30 such that the apertures 74 are registered atop their respective mounting pads 76 (FIGS. 1A–B), (2) applying solder paste 72 to the top or "squeegee" side 78 of the stencil (FIG. 1B), (3) moving a squeegee blade 82 across the top side 78 so as to force the solder paste 72 into the apertures 74 (FIG. 1C), and (4) lowering the PCB away from the stencil, whereupon the solder mass 84 within each aperture is left atop its respective mounting pad 76 (FIG. 1D). Alternatively, a compression printing head may be used instead of a squeegee, as described in U.S. Pat. No. 5,565,033 to Gaynes et al. (incorporated herein by reference).

The shape of each stencil aperture 74 is typically the same as that of the respective mounting pad 76, and the size of the aperture is typically the same as that of the pad or smaller. For example, a 60×90-mil rectangular pad would typically have a correspondingly rectangular stencil aperture sized 60×90 mils or less (e.g., 50×80 mils). The aperture is typically formed with side walls 86 which are substantially straight and generally orthogonal to the top and bottom stencil surfaces 78/80, as illustrated by the apertures 74 labeled "Straight" in FIGS. 1A and 2. Alternatively, the stencil may be a "stepped stencil" wherein at least some of the apertures 74 have the configuration illustrated by the apertures labeled "Stepped" in FIGS. 1A and 2. Such stepped apertures typically comprise (1) a top surface cavity 88 having a given width/length/diameter A and a given depth B, and (2) a bottom surface cavity 90 having a given depth C and a given width/length/diameter D, wherein the cavities 88/90 are generally concentric with one another and in open communication with each other. Note that such aperture configurations provide a ledge 92 which bounds the side walls of the bottom surface cavity 90 and which is defined as the non-cavity portion of the stencil underneath the top surface cavity 88. Examples of prior art stepped stencils are provided in U.S. Pat. No. 4,872,261 to Sanyal et al. and U.S. Pat. No. 5,681,387 to Schmidt (both incorporated herein by reference).

Stepped stencils are most often used where the thickness of solder paste 72 to be deposited on the mounting pads 76 varies from one set of pads to another. By using a stepped stencil, those pads 76 whose apertures 74 are "straight" will have a thickness of solder paste generally equal to the whole thickness T of the stencil 70, while those pads whose apertures are "stepped" will have a solder paste thickness ideally equal to the depth C of the bottom surface cavity 90, as illustrated by the paste deposition labeled "Ideal" in FIG. 1D. But, in practice it is often the case that when the PCB is lowered away from the stencil, the deposition left on the pads is significantly greater or less than the "Ideal" case, as illustrated by the depositions labeled "Actual" in FIG. 1D. Here, either some of the paste that was in the top cavity 88 gets pulled away and sticks to the paste in the bottom cavity 90, thus ending up on the mounting pad, or else some of the paste in the bottom cavity 90 sticks to and stays with the paste in the top cavity 88. This presents a process control problem—namely, the amount of solder deposition becomes too variable from one deposition to another on the same PCB, and too variable for any given stepped aperture from one PCB to another.

While stepped stencils are useful for depositing different depths of solder paste in the same squeegee pass or compression head pass, it would be desirable to find a way of providing this same benefit without the variability inherent in conventional stepped stencils.

SUMMARY OF THE INVENTION

The present invention overcomes the disadvantages of the prior art approaches by providing a self-shearing stencil for use in applying solder paste or other bonding material atop a printed circuit board (PCB) in a predefined pattern. The stencil 50 has a top surface 12, a bottom surface 14, a first surface cavity 16 in the top surface, and a second surface cavity 18 in the bottom surface proximate the first surface. The cavities 16/18 overlap in a predefined manner so as to be in open communication with each other. When the stencil is placed on the PCB, the cavities are filled with solder paste and the PCB is then lowered away from the stencil, whereupon a bottom ledge 26 (defined by the stencil material underneath the first cavity) shears off the solder paste in the first cavity from the paste in the second cavity.

It is an object and advantage that the present invention provides the ability to deposit solder paste depositions having different depths in the same squeegee pass or compression printing pass, while providing a self-shearing aperture geometry which reduces paste deposit variability.

Another advantage is that the stencil according to the present invention may be fabricated using conventional stencil fabrication processes.

Yet another advantage is that the stencil according to the present invention may be fabricated using a novel multi-laminate approach.

These and other advantages, features and objects of the invention will become apparent from the drawings, detailed description and claims which follow.

DETAILED DESCRIPTION OF THE PREFERRED EMBODIMENTS

Figure 1A:
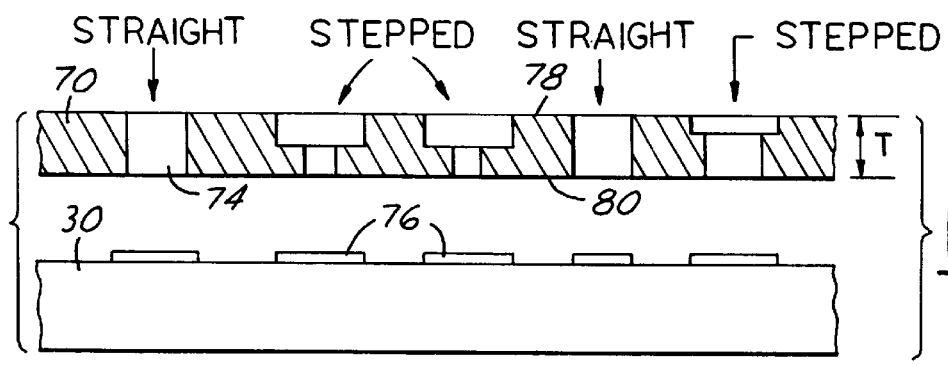
FIGS. 1A–D are side section views of a stencil and substrate according to the prior art, showing successive steps of aligning the stencil and substrate, coupling the stencil and substrate, squeegeeing the solder paste into the stencil apertures, and separating the substrate from the stencil, respectively.
Figure 1B:
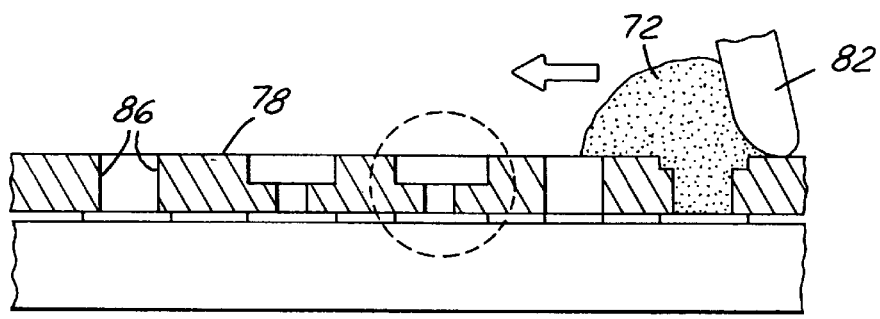
Figure 1C:
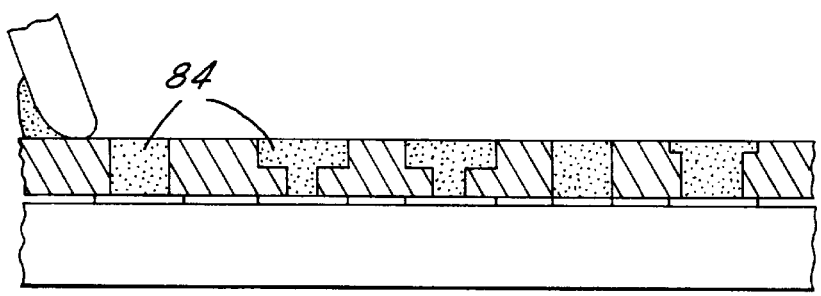
Figure 1D:
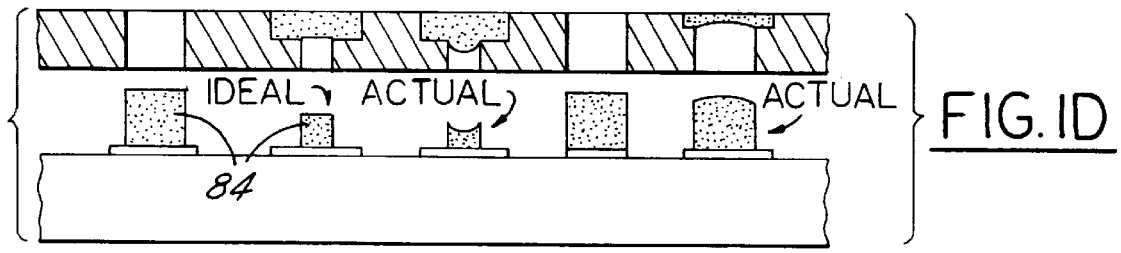
Figure 2:
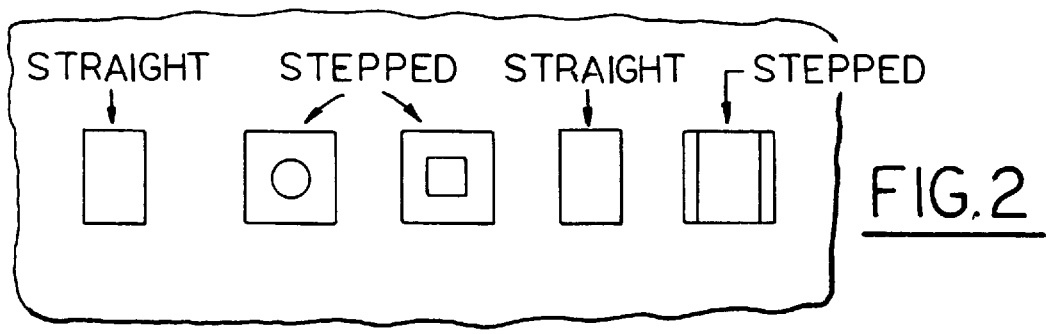
FIG. 2 is a top view of the stencil shown in FIG. 1A.
Figure 3A:
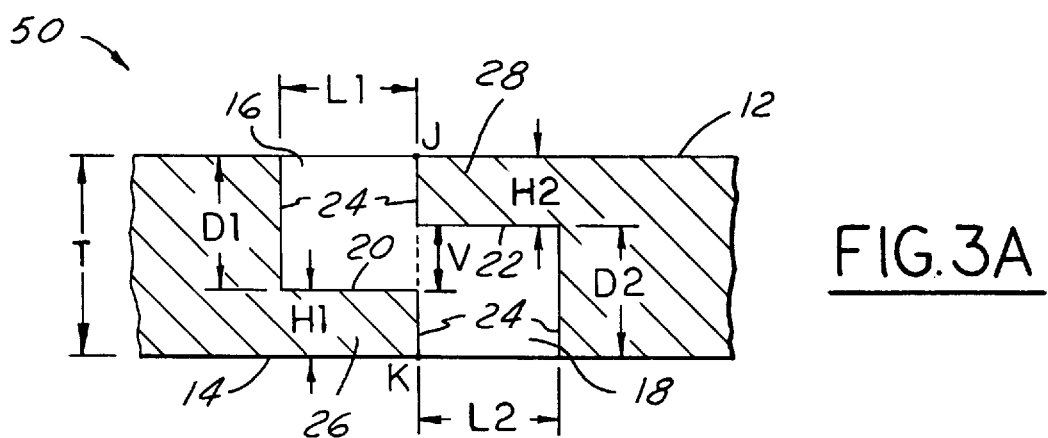
FIGS. 3A–B are side section views of a stencil according to the present invention before and after solder pasting, respectively.
Figure 4:
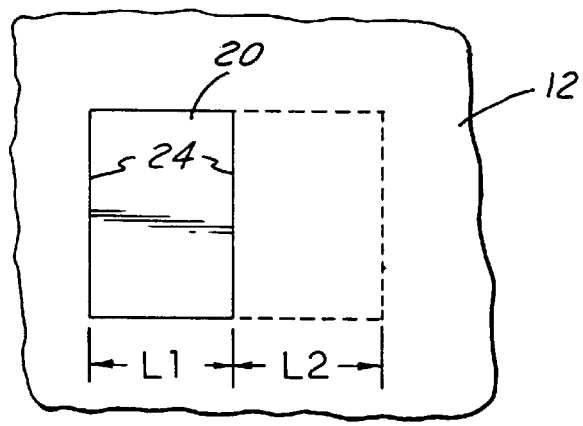
FIG. 4 is a top view of the stencil shown in FIG. 3A.

Referring now to the drawings, FIGS. 3A and 4 show a self-shearing stencil 50 for applying solder paste atop a printed circuit board according to the present invention. The stencil 50 comprises: a generally thin stencil sheet 10 having a top surface 12, a bottom surface 14, and a generally uniform thickness T; a first surface cavity 16 defined on the top surface 12, wherein the first cavity 16 has a predetermined length L1 along the top surface and a predetermined depth D1 less than T; a second surface cavity 18 defined on the bottom surface 14 proximate the first cavity 16, wherein the second cavity 18 has a predetermined length L2 along the bottom surface and a predetermined depth D2 less than T.

To assist the reader in understanding the present invention, all reference numbers used herein are summarized in the table below, along with the elements they represent:

10=Stencil sheet
12=Top surface of stencil sheet
14=Bottom surface of stencil sheet
16=First cavity (in top surface)
18=Second cavity (in second surface)
20=Floor of first cavity
22=Ceiling of second cavity
24=Side walls of first and second cavities
26=Bottom ledge (below first cavity)
28=Top ledge (above second cavity)
30=PCB/substrate surface
32=Solder paste mass in first cavity
34=Solder paste mass in second cavity
36=Sheets laminated to produce stencil sheet
38=Apertures in laminated sheets
40=Adhesive between laminated sheets
50=Stencil according to the present invention
60=Upper and outer corner/edge of bottom ledge
62=Leading edge of bottom ledge
70=Stencil according to prior art
72=Solder paste
74=Apertures in prior art stencil
76=Mounting pads on substrate
78=Top/squeegee side of stencil
80=Bottom/board side of stencil
82=Squeegee
84=Solder mass within each aperture
86=Side walls of aperture
88=Top surface cavity
90=Bottom surface cavity
92=Ledge about bottom cavity/under top cavity
94=Third cavity connecting first and second cavities
A=Length/width/diameter of top cavity
B=Depth of top cavity
C=Depth of bottom cavity
D=Length/width/diameter of bottom cavity
D1=Depth of first cavity
D2=Depth of second cavity
H1=Height (thickness) of bottom ledge
H2=Height (thickness) of top ledge
JK=Vertical line between leading edges of ledges
L1=Length of first cavity
L2=Length of second cavity
OL=Overlap of second cavity into first cavity
UL=Underlap of first and second cavities/ledges
T=Thickness of stencil
V=Vertical offset between top and bottom ledges The stencil sheet 10 may be made of stainless steel, molybdenum, copper (e.g., brass), titanium, nickel, or other suitable materials (e.g., a polymer, such as polyester), with a typical thickness T of between 5 and 250 mils (i.e., between 0.005 and 0.250 inches). For example, the stencil may comprise a 30-mil-thick nickel-plated brass sheet 10. The sheet 10 is preferably of uniform thickness, with the top and bottom surfaces 12/14 being substantially parallel with one another. The sheet 10 may be generally flat, as illustrated in FIG. 3A, or it may be generally curviplanar (i.e., not lying in a flat plane, but having curved portions) as illustrated in FIG. 6B. A generally flat stencil may be used in most applications, such as with conventional flat FR-4 boards, whereas a curviplanar stencil may be used on substrates having contoured or curved surfaces, such as some plastic molded parts that are selectively metallized with circuit traces and used as circuit carriers. When using such curved or contoured substrates, a normally generally flat stencil may be bent and urged into compliance/registration with the substrate, or a permanently curved/contoured stencil may be fabricated and used.

The depth D1/D2 of each cavity 16/18 is preferably greater than half the stencil thickness T, with the combined depths (D1+D2) being preferably at least four-thirds the stencil thickness (i.e., D1+D2≧4⁄3 T). For example, FIG. 3A is scaled such that D1=D2=2⁄3 T, so D1+D2=4⁄3 T. Here, the vertical offset V between the first cavity floor 20 and the second cavity ceiling 22 (i.e., between the top and bottom ledges 26/28) is 1⁄3 T; in other words, H1=H2=V=1⁄3 T. By making the cavity depths D1 and D2 deeper, V is increased and the ledge thicknesses H1/H2 are decreased, thus making it easier for solder paste to pass from the first cavity 16 to the second cavity 18. The vertical offset V, as well as the depths D1/D2 of each cavity 16/18, should be optimized for each case, considering such factors as: the viscosity and other rheological and thixotropic properties of the paste; the length, width, and shape of the solder mass 34 to be deposited atop the substrate; the type of processing used (e.g., squeegee versus compression printing); and so forth.

Figure 3B:
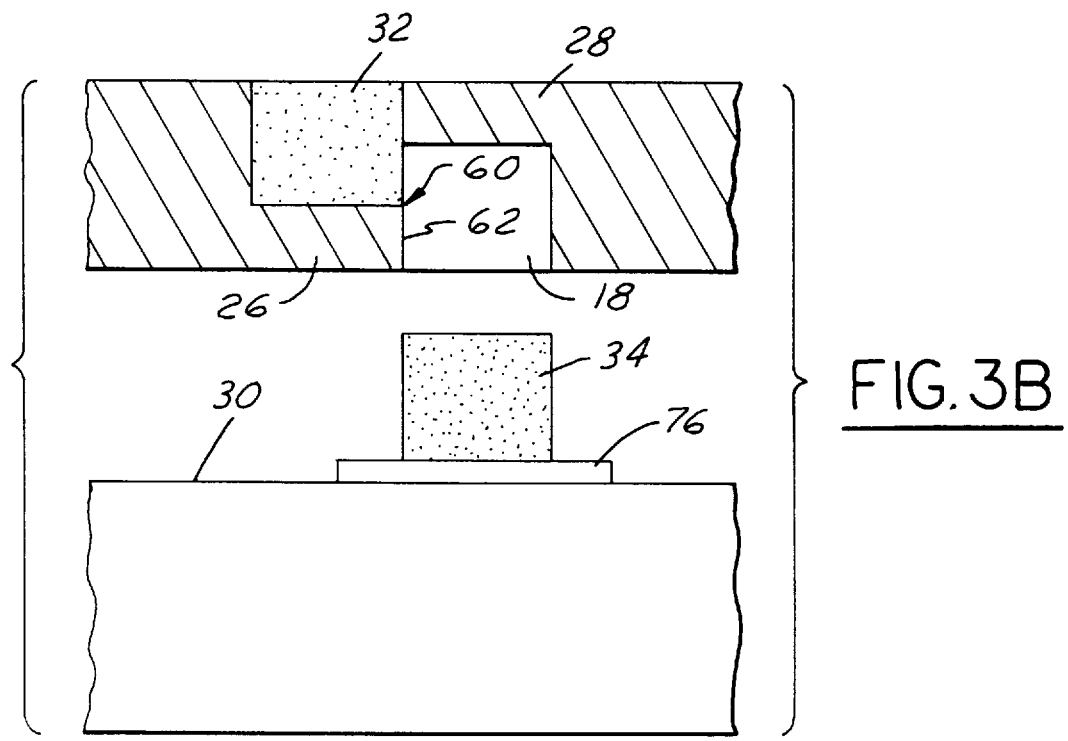
Figure 5:
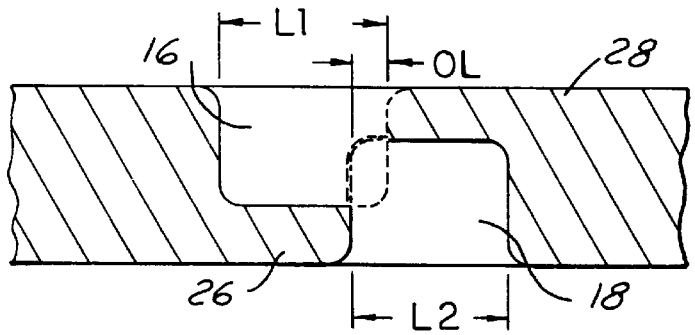
FIG. 5 is a side section view of a chemically etched stencil according to the present invention.

In designing a stencil 50 according to the present invention, two other design features are recommended. First, regardless of whether the combined cavity depth (D1+D2) is at least 4⁄3 T (as recommended above), the combined depths must be greater than the stencil thickness T (i.e., D1+D2>T); if this were not the case, then the two cavities could not be in communication with one another, unless some third cavity or channel were provided therebetween. Second, the second cavity 18 should overlap the first cavity 16 (along the length dimension; i.e., left-and-right in the drawings) at least somewhat, but not too much; a recommended range for cavity overlap OL is between 0% and 25% of L1. A cavity overlap OL of 0% abuts the two cavities 16/18 as shown in FIGS. 3A–B, thus placing the cavities in open communication with each other. An overlap OL of up to about 25% of L1 is illustrated in FIG. 5; this overlap OL can be seen by noting the overlapping region bounded by the single and double dashed lines corresponding to the first and second cavities 16/18, respectively. Also note that in FIGS. 3A–B the top and bottom ledges 28/26 each extend toward each other to the same vertical line JK (but do not overlap one another), whereas in FIG. 5 the ledges 28/26 do not extend quite as far toward each other and in fact underlap each other by a spacing equal to the amount of cavity overlap OL.

Figure 6A:
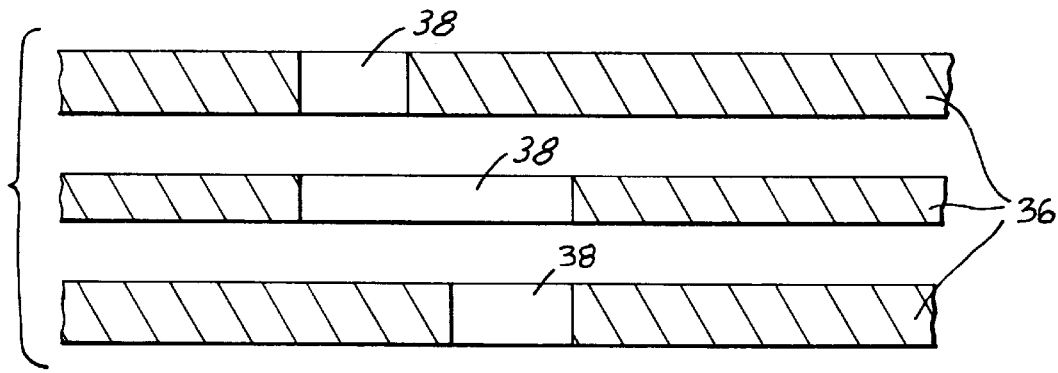
FIGS. 6A–B are side section views of a laminated curviplanar stencil according to the present invention before and after lamination, respectively.
Figure 6B:
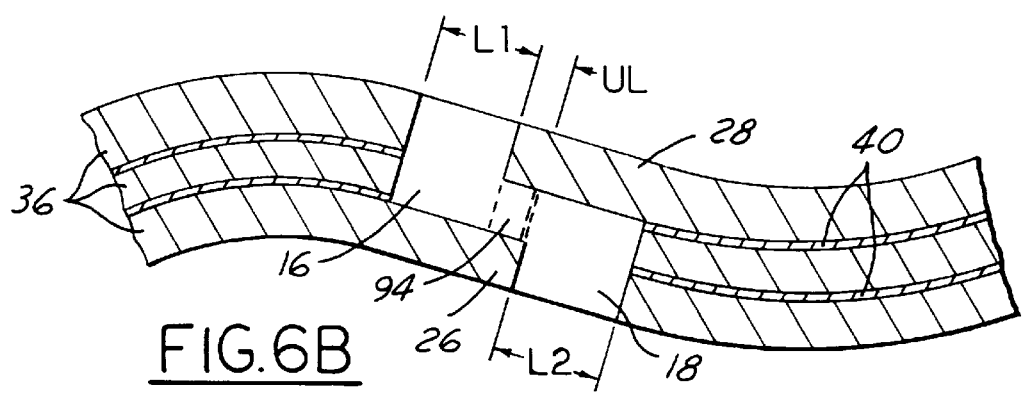
Figure 7:
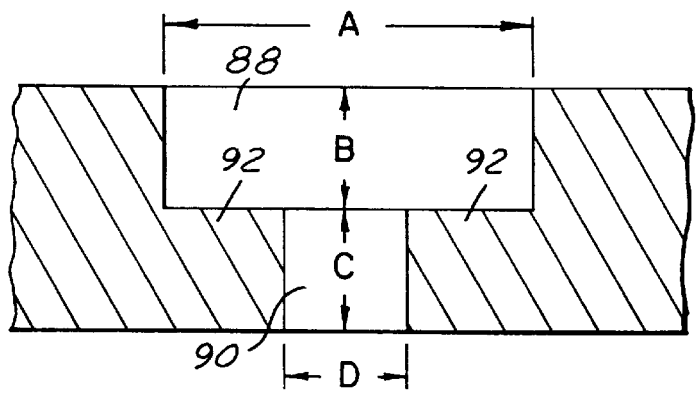
FIG. 7 is an expanded side section view of a stepped stencil aperture of FIG. 1B.

Alternatively, the cavities 16/18 may underlap each other by a given amount UL, as illustrated in FIGS. 6A–B. Here, the cavities 16/18 are placed in communication with each other through a third cavity 94, and the ledges 26/28 overlap each other by a spacing equal to the cavity underlap UL. Such a construction is very difficult to form by conventional chemical etching, laser milling, or EDM methods, so a lamination approach (described below) is recommended. A range for cavity underlap UL of between 0% and 50% of L1 is recommended.

For most applications, the cavities 16/18 will each generally be between 2 and 1000 mils in length L1/L2 and width, depending on the size and shape of the solder paste deposition needed for each component. It may also be desired to size the cavities 16/18 such that their lengths L1/L2 are approximately equal to one another. Because different components have different solder paste deposition needs, and because each PCB typically has a variety of different components thereon, each stencil 50 according to the present invention will typically have a variety of different cavity shapes and sizes.

Preferably, the first cavity 16 has a floor 20 generally parallel with the top and bottom surfaces 12/14, the second cavity 18 has a ceiling 22 generally parallel with the top and bottom surfaces 12/14, and each of the first and second cavities 16/18 has side walls 24 generally orthogonal to the top and bottom surf aces 12/14, as illustrated in FIG. 3A. The plan view of each cavity 16/18, as illustrated in FIG. 4, may be generally polygonal (e.g., rectangular, square, etc.), generally arcuate (e.g., circular, oval, etc.), or any desired combination of straight or curved edges; most typically, each cavity 16/18 will be generally rectangular as viewed in plan.

To some extent, the shape of each cavity may be affected or limited by the fabrication method used to form the cavities. For example, it is sometimes difficult to produce sharp, angular corners using chemical etching to produce the cavities; this process typically produces etched features that are more rounded and filletted, such as the cavities shown in FIG. 5. On the other hand, such processes as EDM and laser milling are capable of producing much sharper features than can be produced with chemical etching, such as shown in FIGS. 3A–B, 4 and 6A–B. Although the process selected to produce the cavities is not critical, it is important that the designer and manufacturer understand how to design for and control the process chosen so that the desired design and manufacturing tolerances may be met without undue difficulty and cost.

An alternative to single-sheet fabrication is illustrated in FIGS. 6A–B, which utilize a multi-sheet lamination approach. In the laminated constructions shown, three sheets 36 have been selectively etched, milled, or otherwise processed in order to form apertures 38 therein, as shown in FIG. 6A. Then, the sheets 36 are aligned and laminated together (e.g., using an adhesive 40 or other suitable means) such that their respective apertures 38 register and form the desired cavities 16/18, as in FIG. 6B. With this approach, sheets 36 of different thicknesses may be used to form cavities 16/18, ledges 26/28, and vertical offsets V with thickness or height dimensions that correspond with the selected sheet thicknesses. When an underlapped-cavity configuration as in FIG. 6B is desired, the lamination approach is the preferred method of construction.

From the drawings and the foregoing descriptions, it may be noted that three configurations of cavity or ledge underlap/overlap are possible; these configurations are summarized in the Table below:

| Config. | FIGS. | Cavities | Ledges | % of L1 |
|---|---|---|---|---|
| I | 5 | Overlapping | Underlapping | $0\% < OL \leq 25\%$ |
| II | 3A–B | Abutting | Abutting | $0\%$ |
| III | 6A–B | Underlapping | Overlapping | $0\% < UL \leq 50\%$ |

Figure 9:
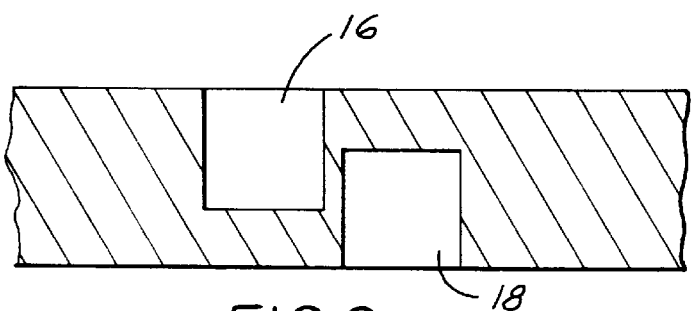
FIG. 9 is a side section view of a non-preferred stencil having misaligned cavities.

Each configuration has its own advantages and disadvantages as compared to the other two configurations. For example, a Config. I arrangement with OL near 25% of L1 is the easiest to manufacture, but may be the least desirable as far as performance. On the other extreme, a Config. III arrangement with UL near 50% of L1 is the most desirable as far as performance, but is also the most difficult to manufacture. Config. II has acceptable performance and, like Config. I, is easy to manufacture; however, it is also easy to misalign the cavities 16/18 such that they are not in communication with each other, as illustrated by FIG. 9. A good balance, then, of both performance and manufacturability is to aim for a Config. I arrangement with an OL somewhere in the middle of the 0%–25% of L1 range; a target of OL=10% of L1 is recommended.

A key feature which distinguishes the present invention over the prior art is that the stencil aperture 34 comprises non-concentric upper and lower surface cavities 16/18 and upper and lower ledges 28/26. Whether using Config. I, II, or III, the upper and outer corner/edge 60 of the lower ledge 26 and the leading edge 62 of the bottom edge both act to shear the solder mass 32 in the first cavity 16 from the solder mass 34 in the second cavity 18 when the pasted stencil is separated from the substrate 30, as clearly illustrated in FIG. 3B. Also, keeping the vertical offset V between the upper and lower ledges 28/26 relatively small helps to promote this self-shearing effect; preferably, V is kept smaller than L1. (Stated another way, the thickness of the ledges—i.e., (T–D1)=H1 for the bottom ledge 26 and (T–D2)=H2 for the top ledge 28—should be designed such that (T–D1)+(T–D2)=H1+H2≧L1.) As can be seen in FIGS. 1A–D and 7, no prior art aperture configuration provides non-concentric overlapping cavities as described herein, nor do they provide the ledges 26/28 which promote the self-shearing action provided by the present invention. This self-shearing feature assures that the solder paste mass 34 in the bottom cavity 18 is cleanly sheared from the mass 32 in the top cavity 16, thus providing consistent, repeatable solder paste deposition volumes.

For stencils having apertures fabricated as in Config. I (see FIG. 5), the amount of cavity overlap OL is preferably kept to about 25% or less of L1. This limit is recommended because the self-shearing effect cannot typically be provided by overlaps larger than this. This in turn is because the physical properties of most solder paste formulations are such that when overlaps of >25% are attempted, the solder mass 34 in the lower cavity 18 cannot be cleanly sheared from the solder paste 32 in the adjacent top cavity 16; in fact, in most cases where OL>25% of L1, the solder paste deposition 34 that ultimately is left atop the mounting pad 76 would often be undersized or oversized similar to the depositions 84 labeled "Actual" in FIG. 1D.

For stencils using Config. III apertures (see FIGS. 6A–B), it is recommended that the cavity underlap UL (i.e., the length of the third cavity 94 adjoining the first and second cavities 16/18) be sized less than about 50% of L1. While a longer underlap UL may be used, it becomes more difficult to fully fill the bottom cavity 18 when the underlap/third cavity length UL becomes unnecessarily long.

Figure 8A:
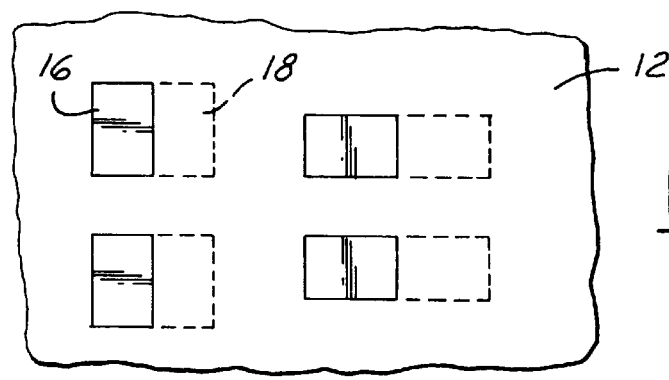
FIGS. 8A–B are top views of a stencil according to the present invention showing uniform and non-uniform first cavity-to-second cavity orientations, respectively.
Figure 8B:
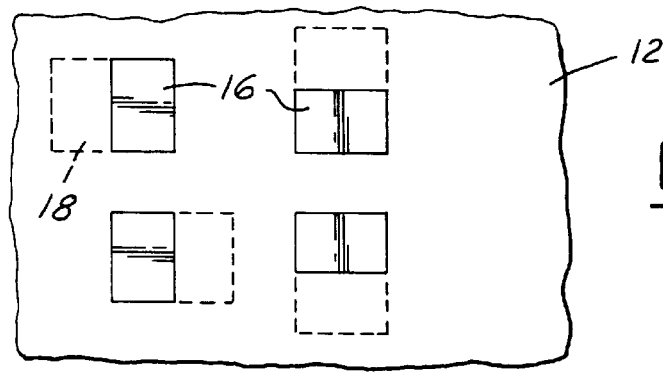

Various other modifications to the present invention may occur to those skilled in the art to which the present invention pertains. For example, in addition to solder paste, other bonding materials such as conductive adhesives (e.g., silver-filled epoxy) and the like may be used with the stencil. Also, the first and second cavities 16/18 on a stencil 50 may all be uniformly aligned as illustrated in FIG. 8A, which shows each second cavity 18 (in dashed lines, beneath the top surface 12 of the stencil) as being to the right of each first cavity 16, or may the cavities 16/18 may be non-uniformly aligned as in FIG. 8B, wherein each second cavity 18 may be to the left, right, up, or down with respect to the first cavity 16. Furthermore, when the stencil is provided with a curviplanar shape, the stencil top surface 12 may be a generally ruled surface (e.g., for squeegee applications) or a generally non-ruled surface (e.g., for use with sqeegeeless systems, including those systems using a compression head that contacts the stencil 12 and which may or may not move across the stencil). Moreover, the separation of the paste 34 in the lower cavity 18 from the paste 32 in the upper cavity 16 may be further facilitated by vibrating the stencil or PCB (such as by ultrasonic excitation) during separation of the PCB from the stencil, particularly by vibrating the stencil/PCB in a direction generally orthogonal to their mating surfaces. Other modifications not explicitly mentioned herein are also possible and within the scope of the present invention. It is the following claims, including all equivalents, which define the scope of the present invention.

What is claimed is:

1. A self-shearing stencil for applying solder paste atop a printed circuit board, comprising:
    a generally thin stencil sheet having a top surface, a bottom surface, and a generally uniform thickness T;
    a first surface cavity defined on said top surface, wherein the first cavity has a predetermined length L1 along said top surface and a predetermined depth D1 less than T;
    a second surface cavity defined on said bottom surface proximate said first cavity, wherein the second cavity has a predetermined length L2 along said bottom surface and a predetermined depth D2 less than wherein D1+D2>T, and
    wherein the second cavity overlaps the first cavity so as to be in open communication therewith.

2. A stencil according to claim 1, wherein the second cavity overlaps the first cavity by between 0% and 25% of L1.

3. A stencil according to claim 1, wherein L1≈L2.

4. A stencil according to claim 1, wherein L1≈L2 and (T−D1)+(T−D2)≧L1.

5. A stencil according to claim 1, wherein D1+D2≧⅓ T.

6. A stencil according to claim 1, wherein D1>0.5 T and D2>0.5 T.

7. A stencil according to claim 1, wherein said stencil sheet is made of stainless steel, molybdenum, copper, nickel, titanium, or a polymer.

8. A stencil according to claim 1, wherein said stencil sheet is generally flat.

9. A stencil according to claim 1, wherein said stencil sheet is generally curviplanar.

10. A stencil according to claim 1, wherein the stencil thickness T is generally between 5 and 250 mils.

11. A stencil according to claim 1, wherein L1 and L2 are each generally between 2 and 1000 mils.

12. A stencil according to claim 1, wherein the first cavity has a floor generally parallel with the top and bottom surfaces, the second cavity has a ceiling generally parallel with the top and bottom surfaces, and each of the first and second cavities has side walls generally orthogonal to the top and bottom surfaces.

13. A self-shearing stencil for applying solder paste atop a printed circuit board, comprising:
    a generally thin metallic stencil sheet having a top surface, a bottom surface, and a generally uniform thickness T;
    a first surface cavity defined on said top surface, wherein the first cavity has a predetermined length L1 along said top surface and a predetermined depth D1 less than T;
    a second surface cavity defined on said bottom surface proximate said first cavity, wherein the second cavity has a predetermined length L2 along said bottom surface and a predetermined depth D2 less than T;
    wherein L1≈L2 and D1+D2>T, and
    wherein the second cavity overlaps the first cavity between 0% and 25% of L1, such that the first cavity is in open communication with the second cavity.

14. A stencil according to claim 12, wherein (T−D1)+(T−D2)≧L1.

15. A stencil according to claim 12, wherein D1>0.5 T and D2>0.5 T, and D1+D2≧⅓ T.

16. A stencil according to claim 12, wherein said stencil sheet is made of stainless steel, molybdenum, copper, nickel, or titanium.

17. A stencil according to claim 1, wherein said stencil sheet is generally flat or generally curviplanar.

18. A stencil according to claim 1, wherein the stencil thickness T is generally between 5 and 250 mils, and wherein L1 and L2 are each generally between 2 and 1000 mils.

19. A stencil according to claim 1, wherein the first cavity has a floor generally parallel with the top and bottom surfaces, the second cavity has a ceiling generally parallel with the top and bottom surfaces, and each of the first and second cavities has side walls generally orthogonal to the top and bottom surfaces.

20. A self-shearing stencil for applying solder paste atop a printed circuit board, comprising:
    a generally thin metallic stencil sheet having a top surface, a bottom surface, and a generally uniform thickness T;
    a first surface cavity defined on said top surface, wherein the first cavity has a predetermined length L1 along said top surface and a predetermined depth D1 less than T;
    a second surface cavity defined on said bottom surface proximate said first cavity, wherein the second cavity has a predetermined length L2 along said bottom surface and a predetermined depth D2 less than
    wherein L1≈L2 and D1+D2>T, and
    wherein the second cavity overlaps the first cavity between 0% and 25% of L1, such that the first cavity is in open communication with the second cavity,
    wherein the first cavity has a floor generally parallel with the top and bottom surfaces, the second cavity has a ceiling generally parallel with the top and bottom surfaces, and each of the first and second cavities has side walls generally orthogonal to the top and bottom surfaces.

* * * * *